(12) United States Patent
Linder et al.

(10) Patent No.: US 8,357,616 B2
(45) Date of Patent: Jan. 22, 2013

(54) ADJUSTABLE SOLUBILITY IN SACRIFICIAL LAYERS FOR MICROFABRICATION

(75) Inventors: Vincent Linder, Wilmington, MA (US); Declan Ryan, County Kerry (IE); Byron Gates, Burnaby (CA); Babak Amir-parviz, Seattle, WA (US); George M. Whitesides, Newton, MA (US)

(73) Assignee: President and Fellows of Harvard College, Cambridge, MA (US)

( * ) Notice: Subject to any disclaimer, the term of this patent is extended or adjusted under 35 U.S.C. 154(b) by 885 days.

(21) Appl. No.: 11/918,269

(22) PCT Filed: Apr. 14, 2006

(86) PCT No.: PCT/US2006/014184
§ 371 (c)(1), (2), (4) Date: Feb. 20, 2009

(87) PCT Pub. No.: WO2006/113492
PCT Pub. Date: Oct. 26, 2006

(65) Prior Publication Data
US 2009/0236310 A1    Sep. 24, 2009

Related U.S. Application Data

(60) Provisional application No. 60/671,415, filed on Apr. 14, 2005.

(51) Int. Cl.
*H01L 21/302* (2006.01)
*H01L 21/461* (2006.01)

(52) U.S. Cl. .............. 438/745; 216/41; 216/48

(58) Field of Classification Search ........... None
See application file for complete search history.

(56) References Cited

U.S. PATENT DOCUMENTS

| 3,664,899 A | * | 5/1972 | Wright et al. ............ 216/48 |
| 4,016,932 A | | 4/1977 | Kalfoglou |
| 4,171,282 A | | 10/1979 | Mueller |
| 4,276,368 A | | 6/1981 | Heller et al. |
| 4,332,879 A | | 6/1982 | Pastor et al. |
| 4,415,293 A | | 11/1983 | Engel et al. |
| 4,547,456 A | | 10/1985 | Kojima et al. |
| 4,605,484 A | | 8/1986 | Shiroki et al. |
| 4,617,056 A | | 10/1986 | Mosser et al. |

(Continued)

FOREIGN PATENT DOCUMENTS

| CA | 2140001 A1 | 7/1996 |
| EP | 0333407 A2 | 9/1989 |

(Continued)

OTHER PUBLICATIONS

Linder, V. et al., "Water-Soluble Sacrificial Layers for Surface Micromachining," Small 2005, 1(7), 730-736.

(Continued)

*Primary Examiner* — Duy Deo
(74) *Attorney, Agent, or Firm* — Wolf, Greenfield & Sacks, P.C.

(57) ABSTRACT

The present invention provides fabrication methods using sacrificial materials comprising polymers. In some embodiments, the polymer may be treated to alter its solubility with respect to at least one solvent (e.g., aqueous solution) used in the fabrication process. The preparation of the sacrificial materials is rapid and simple, and dissolution of the sacrificial material can be carried out in mild environments. Sacrificial materials of the present invention may be useful for surface micromachining, bulk micromachining, and other microfabrication processes in which a sacrificial layer is employed for producing a selected and corresponding physical structure.

26 Claims, 14 Drawing Sheets

U.S. PATENT DOCUMENTS

| | | | |
|---|---|---|---|
| 4,659,650 A | | 4/1987 | Moritz et al. |
| 4,699,870 A | * | 10/1987 | Iwadate et al. ............... 430/296 |
| 4,735,820 A | | 4/1988 | Agostino et al. |
| 4,919,787 A | | 4/1990 | Chester et al. |
| 4,943,513 A | | 7/1990 | Lipson et al. |
| 4,948,707 A | | 8/1990 | Johnson et al. |
| 5,141,806 A | | 8/1992 | Koontz |
| 5,173,169 A | | 12/1992 | Garrison et al. |
| 5,230,814 A | | 7/1993 | Naae et al. |
| 5,264,328 A | | 11/1993 | DellaGuardia et al. |
| 5,354,264 A | | 10/1994 | Bae et al. |
| 5,372,852 A | | 12/1994 | Titterington et al. |
| 5,427,895 A | | 6/1995 | Magnuson et al. |
| 5,443,685 A | | 8/1995 | Goossen et al. |
| 5,490,882 A | | 2/1996 | Sachs et al. |
| 5,504,385 A | | 4/1996 | Jin et al. |
| 5,509,557 A | | 4/1996 | Jimarez et al. |
| 5,690,839 A | | 11/1997 | Min |
| 5,763,548 A | | 6/1998 | Matyjaszewski et al. |
| 5,786,925 A | | 7/1998 | Goossen et al. |
| 5,788,738 A | | 8/1998 | Pirzada et al. |
| 5,994,779 A | | 11/1999 | Gardner et al. |
| 6,120,131 A | | 9/2000 | Murthy et al. |
| 6,139,920 A | | 10/2000 | Smith et al. |
| 6,258,732 B1 | | 7/2001 | Lin et al. |
| 6,260,956 B1 | | 7/2001 | Narang et al. |
| 6,268,457 B1 | | 7/2001 | Kennedy et al. |
| 6,348,239 B1 | | 2/2002 | Hill et al. |
| 6,355,270 B1 | | 3/2002 | Ferrari et al. |
| 6,387,331 B1 | | 5/2002 | Hunter |
| 6,402,933 B1 | | 6/2002 | Dowling |
| 6,569,382 B1 | | 5/2003 | Edman |
| 6,585,764 B2 | | 7/2003 | Wright et al. |
| 6,621,086 B1 | | 9/2003 | Appleby |
| 6,635,583 B2 | | 10/2003 | Bencher et al. |
| 6,641,678 B2 | | 11/2003 | DeYoung et al. |
| 6,652,808 B1 | | 11/2003 | Heller et al. |
| 6,660,632 B2 | | 12/2003 | Hill et al. |
| 6,663,615 B1 | | 12/2003 | Madou et al. |
| 6,663,870 B2 | | 12/2003 | Hart et al. |
| 6,682,189 B2 | | 1/2004 | May et al. |
| 6,706,473 B1 | | 3/2004 | Edman et al. |
| 6,709,554 B2 | | 3/2004 | Ferranti et al. |
| 6,713,235 B1 | | 3/2004 | Ide et al. |
| 6,783,525 B2 | | 8/2004 | Greep et al. |
| 6,793,753 B2 | | 9/2004 | Unger et al. |
| 6,818,313 B2 | | 11/2004 | Phelps et al. |
| 6,825,068 B2 | | 11/2004 | Denis et al. |
| 6,833,276 B2 | | 12/2004 | Klaerner et al. |
| 6,852,266 B2 | | 2/2005 | Robinson et al. |
| 6,879,424 B2 | | 4/2005 | Vincent et al. |
| 6,884,727 B2 | | 4/2005 | Zhang et al. |
| 6,893,877 B2 | | 5/2005 | Hunter et al. |
| 6,951,559 B1 | | 10/2005 | Greep |
| 6,953,388 B2 | | 10/2005 | Shimagaki et al. |
| 7,005,378 B2 | | 2/2006 | Crocker et al. |
| 7,012,125 B2 | | 3/2006 | Kennedy et al. |
| 7,049,373 B2 | | 5/2006 | Matyjaszewski et al. |
| 7,056,840 B2 | | 6/2006 | Miller et al. |
| 7,060,224 B2 | | 6/2006 | Edman et al. |
| 7,112,472 B2 | | 9/2006 | Dubin |
| 7,135,448 B2 | | 11/2006 | Lentsch et al. |
| 7,140,861 B2 | | 11/2006 | Watts et al. |
| 7,192,686 B2 | | 3/2007 | Meagley |
| 7,208,334 B2 | | 4/2007 | Asakawa et al. |
| 7,244,669 B2 | | 7/2007 | Sirringhaus et al. |
| 7,279,146 B2 | | 10/2007 | Nassef et al. |
| 7,300,594 B2 | | 11/2007 | Arredondo et al. |
| 7,307,802 B2 | | 12/2007 | Unger |
| 7,374,944 B2 | | 5/2008 | Thompson et al. |
| 7,375,369 B2 | | 5/2008 | Sen et al. |
| 7,375,404 B2 | | 5/2008 | Park et al. |
| 7,553,584 B2 | | 6/2009 | Chiang et al. |
| 2002/0022592 A1 | | 2/2002 | Detmar et al. |
| 2002/0024050 A1 | | 2/2002 | Odekirk et al. |
| 2002/0115305 A1 | * | 8/2002 | Tsai et al. .................. 438/781 |
| 2002/0121909 A1 | | 9/2002 | Sato et al. |
| 2002/0137059 A1 | | 9/2002 | Wu et al. |
| 2003/0030800 A1 | | 2/2003 | Golden et al. |
| 2003/0031911 A1 | | 2/2003 | Ritts et al. |
| 2003/0108879 A1 | * | 6/2003 | Klaerner et al. ................ 435/6 |
| 2003/0109865 A1 | | 6/2003 | Greep et al. |
| 2003/0175410 A1 | | 9/2003 | Campbell et al. |
| 2003/0228681 A1 | | 12/2003 | Ritts et al. |
| 2004/0017428 A1 | | 1/2004 | Cronin et al. |
| 2004/0115279 A1 | | 6/2004 | Hansford et al. |
| 2004/0115696 A1 | | 6/2004 | Heller et al. |
| 2004/0209355 A1 | | 10/2004 | Edman et al. |
| 2005/0019792 A1 | | 1/2005 | McBride et al. |
| 2005/0072495 A1 | | 4/2005 | Sohi et al. |
| 2005/0085053 A1 | | 4/2005 | Chen et al. |
| 2005/0096587 A1 | | 5/2005 | Santini et al. |
| 2005/0161326 A1 | | 7/2005 | Morita et al. |
| 2005/0171277 A1 | | 8/2005 | Li et al. |
| 2005/0232964 A1 | | 10/2005 | Fennimore et al. |
| 2005/0272806 A1 | | 12/2005 | Falotico et al. |
| 2006/0003271 A1 | | 1/2006 | Clark et al. |
| 2006/0019183 A1 | | 1/2006 | Voisin et al. |

FOREIGN PATENT DOCUMENTS

| | | |
|---|---|---|
| EP | 0363210 A2 | 4/1990 |
| EP | 1628510 A2 | 2/2006 |
| JP | 02-222953 A | 9/1990 |
| JP | 10-119230 A | 5/1998 |
| JP | 2002-219695 A | 8/2002 |
| WO | WO 98/28320 | 7/1998 |
| WO | WO 99/67678 | 12/1999 |
| WO | WO 00/60652 A1 | 10/2000 |
| WO | WO 01/34765 | 5/2001 |
| WO | WO 01/53799 | 7/2001 |
| WO | WO 02/43615 | 6/2002 |
| WO | WO 2004/032306 | 4/2004 |
| WO | WO 2004/042797 A2 | 5/2004 |
| WO | WO 2004/092806 | 10/2004 |
| WO | WO 2004/095571 | 11/2004 |
| WO | WO 2004/100281 | 11/2004 |
| WO | WO 2005/041255 | 5/2005 |
| WO | WO 2005/049196 | 6/2005 |
| WO | WO 2005/060668 | 7/2005 |
| WO | WO 2005/072353 | 8/2005 |
| WO | WO 2005/084191 | 9/2005 |
| WO | WO 2005/091395 | 9/2005 |
| WO | WO 2005/107723 | 11/2005 |

OTHER PUBLICATIONS

International Search Report and Written Opinion, mailed Sep. 25, 2006, from PCT/US2006/014184.

International Preliminary Report on Patentability, mailed Aug. 14, 2007, from PCT/US2006/014184.

Translation of Office Action including results of prior art search in related Japanese Patent Application No. 2008-506776, mailed Aug. 9, 2011.

* cited by examiner

ADJUSTABLE SOLUBILITY IN SACRIFICIAL LAYERS FOR MICROFABRICATION

RELATED APPLICATIONS

This application is a U.S. National of PCT/US2006/014184 filed Apr. 14, 2006, entitled "Adjustable Solubility in Sacrificial Layers for Microfabrication," which claims the benefit of U.S. Provisional Patent Application Ser. No. 60/671,415, filed Apr. 14, 2005, entitled "Water-Soluble Sacrificial Layers for Microfabrication," by Linder, et al., incorporated herein by reference.

BACKGROUND

The sacrificial layers that are currently predominantly used for microfabrication processes such as micromachining are almost exclusively inorganic materials, the most commonly used being silica, i.e., silicon dioxide, $SiO_2$. Aqueous hydrofluoric acid, HF, selectively etches $SiO_2$ in the presence of silicon and silicon nitride, among other materials. This acid also etches phosphosilicate glass, PSG, faster than thermally grown $SiO_2$, and can under-etch PSG over dimensions up to 2000 μm, with only minor damage to silicon or silicon nitride microstructures. HF also etches many other materials, including metal oxides and organic polymers. Although some non-silicon based materials, e.g., titanium and aluminum, can be used as sacrificial layers to be removed by an HF etch, the poor selectivity of this etch beyond oxides limits its usefulness with a wide range of relatively fragile microelectronic materials. Further, the toxicity of HF makes it inconvenient and/or hazardous for inexperienced users, and it poses difficult disposal requirements. HF-free etching solutions for aluminum are available, based on mixtures of acids and oxidants, e.g., concentrated phosphoric and nitric acids, hydrogen peroxide, and acetic acid, but are also incompatible with some fragile materials. Aside from oxide-based sacrificial materials, it has been shown that porous silicon can be employed as a sacrificial material in the fabrication of microsystems. Such can be removed by a final dissolution in an alkaline environment such as KOH.

Organic polymers—poly(imide), PMMA and photoresist—have also been used as sacrificial layers for micromachining. The removal of poly(imide) films by reactive ion etching (RIE) is compatible with most inorganic materials, but RIE has little selectivity in etching most organic materials. Sacrificial layers of photoresist can be removed by dissolution in acetone, or by thermal degradation, but these removal steps are incompatible with many other organic polymers. Photoresists that are used as sacrificial layers are also limited by their thermal sensitivity, that is, the photoresist film becomes insoluble in acetone after extended exposure to high temperatures. Sacrificial layers of photoresist are, therefore generally restricted to systems including only inorganic materials, and to processes having a minimal exposure to high temperatures. Polycarbonate, polystyrene, and polynorbornene have been reported as sacrificial materials for very specific applications, such as the preparation of sealed nanochannels. Poly(dimethylsiloxane), poly(methyl methacrylate) and epoxy-based polymers, removed by etching or thermal decomposition, have been used as sacrificial templates for the fabrication of metallic heat-exchangers.

SUMMARY OF THE INVENTION

The invention provides water-soluble polymers as sacrificial layers for surface micromachining, bulk micromachining, and other microfabrication processes in which a sacrificial layer is employed for producing a selected and corresponding physical structure. Water-soluble PAA and dextran are preferred sacrificial materials in accordance with the invention, having been experimentally found to demonstrate the most useful combination of properties in the context of sacrificial layers. The preparation of these sacrificial layers is rapid and simple, and their dissolution can be carried out in mild environments, such as in water or in an aqueous NaCl solution. These sacrificial materials offer an alternative to HF-based chemistry for micromachining and other microelectronic applications, and enable the use of organic polymers, easily oxidized metals, ITO, and other metal oxides for fabrication sequences that require a selective sacrificial material etch.

The invention further provides the ability to control the solubility of sacrificial materials during a fabrication sequence. Preferably, the solubility of a sacrificial material can be fully reversed in accordance with the invention. For example, the invention provides the reversible modification of PAA solubility in water, by ion exchange of $Na^+$ with $Ca^{2+}$. This technique of reversible solubility modification is useful for micromachining on silicon wafers, and expands multi-level fabrication to a range of materials that previously were excluded because of their sensitivity to HF, plasma oxidation or other harsh chemicals.

The invention further provides methods for preparation of metallic microstructures. In one example of such, a metal structure is formed by electrodeposition on, e.g., poly(ethylene terephtalate) (PET) disks coated with indium-tin oxide (ITO). Further, the invention provides techniques for fabricating free-standing structures in epoxy-based polymers prepared on plastic substrates and silicon wafers.

The microfabrication methods of the invention are particularly useful for the fabrication of MEMS and the integration of MEMS directly on the surface of CMOS chips, which are typically encapsulated in either $SiO_2$ and/or aluminum.

The present invention provides methods for microfabrication, or other small-scale fabrication processes, comprising forming a sacrificial material comprising a polymer on a substrate, the polymer having a solubility with respect to at least one solvent used in the fabrication process; treating the polymer to alter the solubility of the polymer with respect to the solvent; carrying out a fabrication process, using the polymer as sacrificial material; and removing the polymer at least in part by dissolving the polymer in the solvent.

The present invention also provides methods for microfabrication or other small-scale fabrication process, comprising forming a sacrificial material comprising a polymer on a substrate, wherein the polymer is soluble in aqueous solution; treating the sacrificial material with a bivalent ion such that the polymer becomes substantially insoluble in aqueous solution; removing the bivalent ion from the sacrificial material such the polymer becomes soluble in aqueous solution; and removing the sacrificial material.

DETAILED DESCRIPTION OF THE INVENTION

Figure 1A:
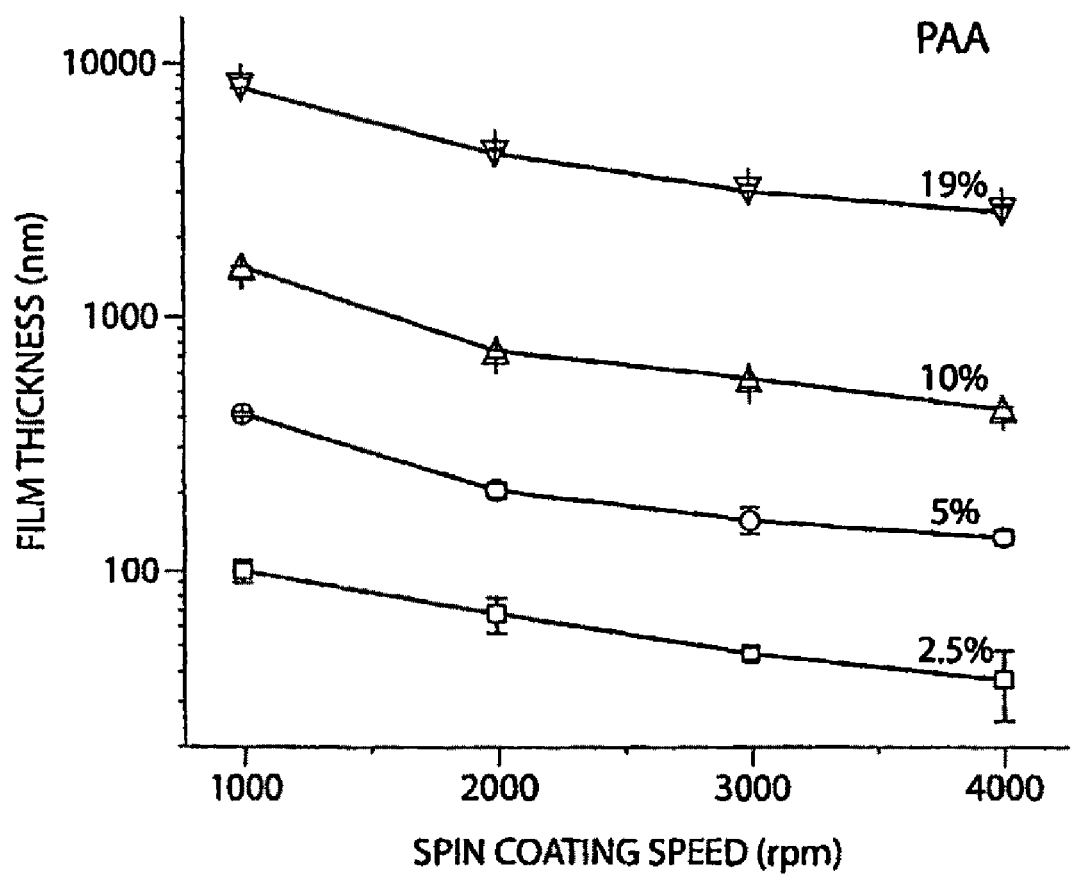
FIG. 1 shows the film thickness as a function of spin-coating velocity and polymer concentration for (a) poly (acrylic acid) (PAA) films using 19% to 2.5% (w/v) aqueous solution of PAA (50 kDa) and (b) dextran films using 20% to 2.5% (w/v) aqueous solutions of dextran (66 kDa). Error bars indicate the standard deviation with n=3.

In accordance with the invention, there is employed a water-soluble polymer as a sacrificial layer in a micromachining or other microfabrication process. The term "sacrificial" is herein meant to refer to a material layer that is employed as a mechanical place holder in a sequence of fabrication steps in which multiple materials are processed for producing a mechanical structure; once the relevant structural features are formed, the sacrificial layer is removed while the other materials are maintained in place, thereby to produce the desired mechanical structure. Sacrificial layers are important fabrication tools for producing, e.g., structures suspended over a substrate, as well as mechanical structures that include, e.g., cavities, moveable elements, and other three-dimensional features to be released in a final geometry at the end of a fabrication sequence.

The invention provides materials suitable for use as sacrificial material in a microfabrication or other fabrication process, where the material can be altered in solubility with respect to at least one solvent used in the process. Although water-soluble materials are described primarily herein in this context, it is to be understood that materials having solubility with respect to other solvents can be used in the same manner. Based upon the instant disclosure, those of ordinary skill in the art, without undue experimentation, can select non-aqueous-based solvents and related materials for use in the process.

As noted, in one specific embodiment, the invention provides water-soluble polymer materials as sacrificial layers for enabling removal of the layers with little or no impact on surrounding materials. Table 1 identifies a number of candidate water-soluble polymers for use in the invention and their properties. The water-soluble polymers of Table 1 are all available in bulk quantities and therefore can be conveniently obtained for large-scale fabrication processes.

Materials for use in the invention can be selected by those of ordinary skill in the art, without undue experimentation. In selecting these materials, one may first look to the chemical structure of the materials. For example, if a material is desirably controlled with respect to solubility in an aqueous-based solvent, then one might look to the chemical structure of the material to determine whether ion content control and/or ion exchange may be possible in the material to render the material more or less water soluble. Other materials can be similarly examined at the molecular level for their potential for solubility control. Additionally, simple screening tests can be used to determine whether materials can be controlled with respect to solubility in a particular solvent, so that they can be rendered less soluble in an environment where they are desirably maintained in a structure during processing (e.g., for use as a sacrificial material), and then rendered more soluble for removal from the system. A simple test, which can be carried out in a routine laboratory environment, involves simply exposing the material to a variety of candidate processing solvents to determine solubility, exposing the material to a variety of candidate environments that could alter solubility of the material in a solvent, and then exposing the material to the candidate solvent after altering. Different sample portions of the material can be used in these separate stages of this test, or a single portion of material can be subjected to all portions of the test. When a class of materials has been identified as potentially suitable for use in the invention in this way, individual members of that class can be screened prior to use in an actual processing environment, to determine their efficacy.

Films of organic polymer sacrificial layers of the invention can be prepared on flat substrates by spin-coating, followed by baking to remove the remaining solvent. In an experimental procedure, a 5% (w/v) polymer solution in water was prepared for each of the polymers listed in Table 1 and corresponding sacrificial layers were prepared by spin-coating at 3000 rpm, for 15 s, except for the polymers with a poor solubility in water, including poly(ethylene oxide), which was instead prepared from 100 kDa with 1% w/v, poly(methacrylic acid) which was prepared with 1.7% w/v, and poly(vinyl alcohol), which was prepared with 2.5% w/v. The films were then dried by placing the substrates on a hot plate at 150° C. for 2 minutes.

The uniformity of the spun and baked films was then ascertained. A film uniformity was considered "good" if fewer than two inhomogeneities were detectable by optical microscopy in bright field mode on a 3-inch wafer. A film dissolution was considered "good" if the film dissolved in water in less than 1 s. The solubility in water after a photolithographic step was considered "good" if discs of SU8-2010 photoresist could be lifted-off in water following the experimental example described below. The root mean square (RMS) roughness of each film as measured by AFM. Before preparation of the films, a RMS roughness of 0.21 nm was measured on silicon substrates.

In one set of embodiments, poly (acrylic acid) (PAA), dextran and poly(methacrylic acid) (PMA) are used as sacrificial materials in accordance with the invention. These materials are examples of those that provide a water-soluble sacrificial layer enabling the production of: i) homogeneous films after spin-coating, ii) water-soluble films before and after photolithography, and iii) insoluble films in organic solvents before and after photolithography. Because of the poor solubility of PMA in water, aqueous solutions of this polymer with a concentration larger than 1.7% (w/v) cannot be prepared, however. This limitation makes it impractical to prepare thick films (>500 nm) by spin-coating. For many applications, sacrificial layers of PAA and dextran can therefore be most preferred.

When spin-coating a sacrificial layer onto a substrate, the final thickness of the film depends on the viscosity of the polymer solution, that is, on the concentration and the molecular weight of the polymer, and on the speed of spin-coating. To evaluate the film thicknesses as a function of coating parameters, films were prepared from aqueous solutions ranging between 2.5% and 19% (w/v) PAA and 2.5 to 20% (w/v) dextran, by spin-coating these solutions onto planar substrates at velocities ranging between 1000 rpm and 4000 rpm. The sacrificial layer was dissolved from over about half of the surface of the substrate with a stream of water from a water bottle, and the substrate was then dried with a stream of nitrogen gas. The thickness of the film was then determined by averaging profilometry measurements at three different locations on each substrate.

Figure 1B:
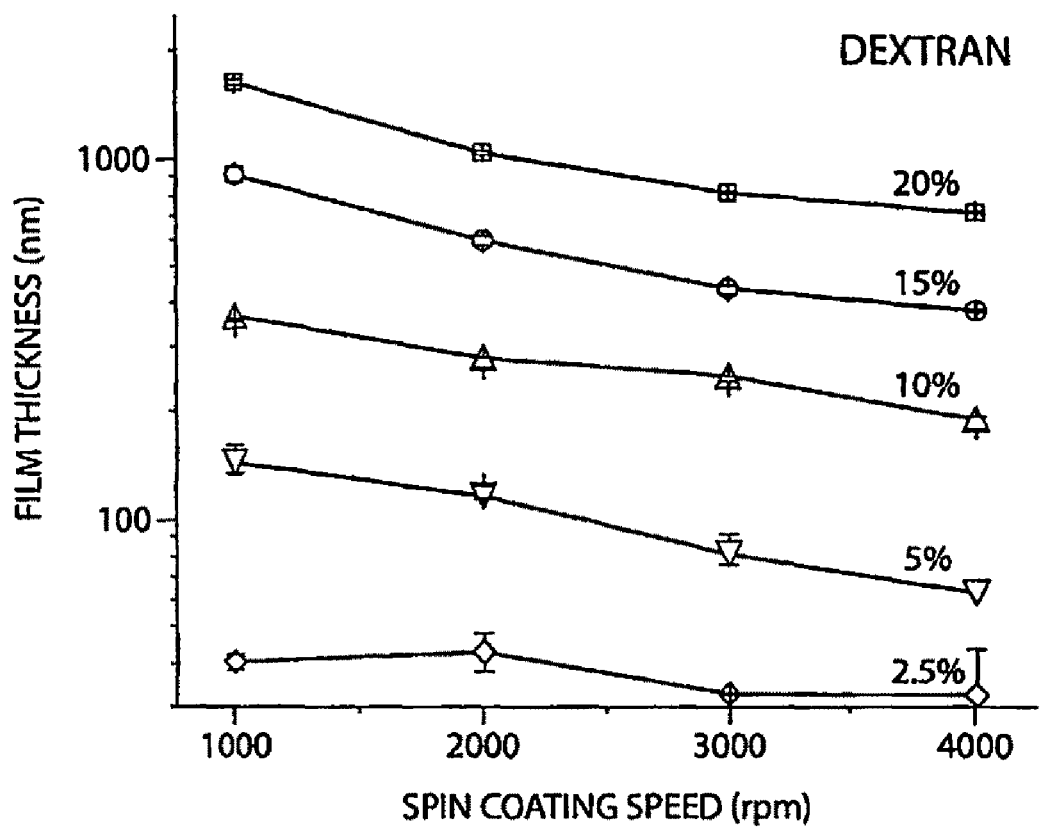

FIGS. 1A and 1B are plots of film thickness as a function of spin-coating velocity and polymer concentration for PAA films using 19% to 2.5% (w/v) aqueous solution of PAA (50 kDa), and dextran films using 20% to 2.5% (w/v) aqueous solutions of dextran (66 kDa), respectively. Error bars indicate the standard deviation with n=3.

It is found that the thickness of a PAA sacrificial layer can be adjusted between ~40 nm and 9 μm, and that the thickness of a dextran sacrificial layer can be adjusted between ~40 nm and 1.1 μm with the various coating speeds and solution content. The viscosities for aqueous solutions of 50 kDa PAA were $1.49 \cdot 10^{-2}$ Pa·s at 5% and $3.67 \cdot 10^{-1}$ Pa·s at 19%, and for solutions of 66-kDa dextran were $2.94 \cdot 10^{-3}$ Pa·s at 5% and $2.85 \cdot 10^{-2}$ Pa·s at 20%.

Dextran and PAA sacrificial layers are insoluble in most organic solvents. PAA layers are found to be insoluble in acetone and isopropyl alcohol. PAA layers are also insoluble in γ-butyrolactone, 1-methoxy-2-propanol-acetate (PGMEA) and 1-methyl-2-pyrrolidinone (NMP), which are three key solvents, namely, the solvent for the prepolymer resin, the developer, and the solvent for lift-off, respectively. PAA layers are further found to be insoluble in bisphenol-A-formaldehyde and epoxy-based photoresists such as SU8 from MicroChem, Inc. PAA films are also found to be stable in acetonitrile, dimethylformamide, hexanes, ethanol and dimethylsulfoxide. The thickness of a PAA film does not change by more than 20% after immersion in one of these solvents for one hour. It was experimentally found, however, that a dextran film is damaged, i.e., mm-scale holes appear in the film, upon exposure to ethanol, and can be completely dissolved in dimethylsulfoxide. Films of dextran are, however, found to be stable in the other solvents, i.e., the acetone, isopropyl alcohol, γ-butyrolactone, PGMEA, NMP, acetonitrile and hexanes.

Figure 2A:
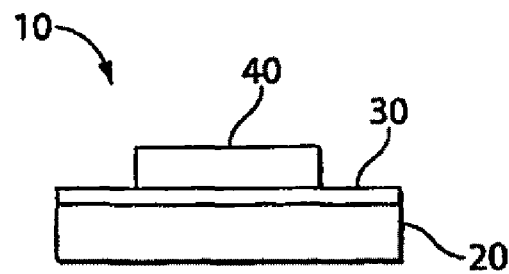
FIG. 2 shows a schematic illustration for the etching of a PAA film under a disc of SU8, according to one embodiment of the invention.
Figure 2B:
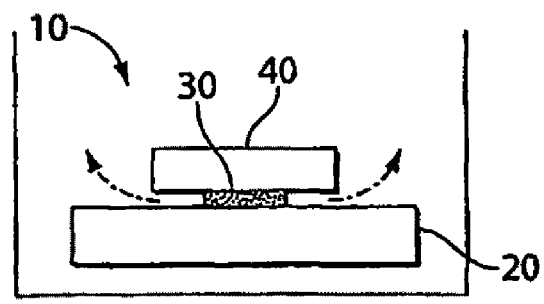
Figure 3:
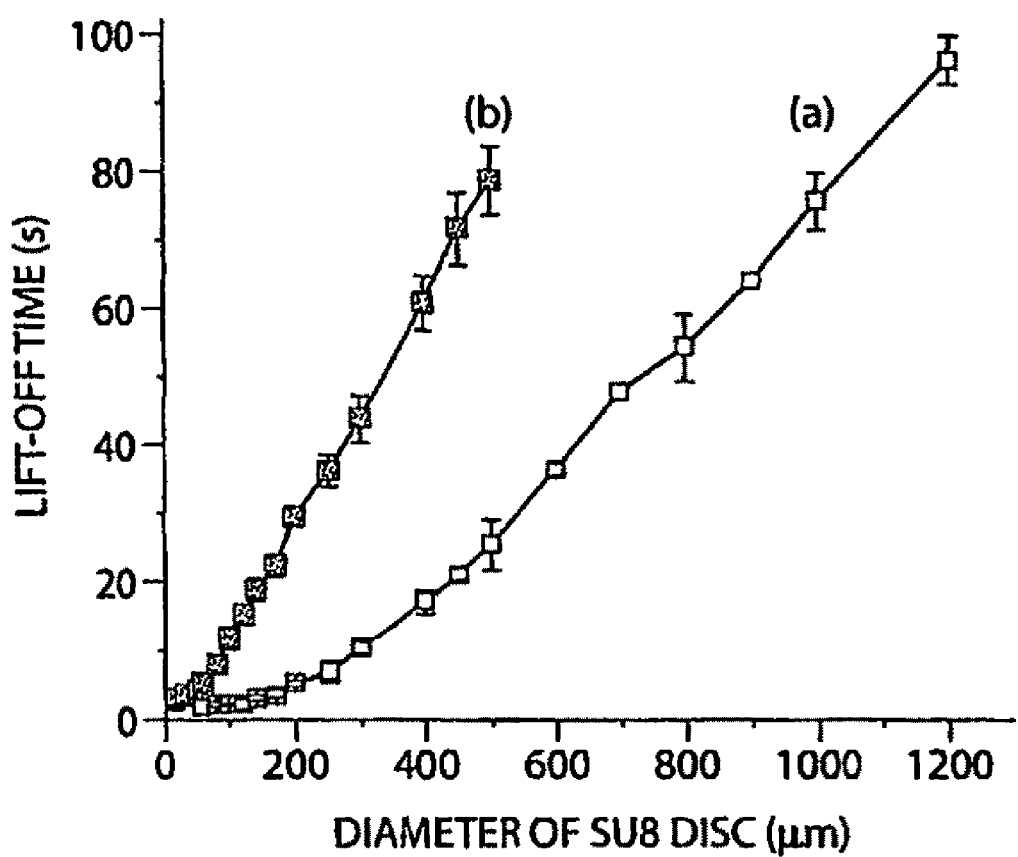
FIG. 3 shows the time required to lift-off 10-micron thick SU8 discs as a function of SU8 disc diameter by dissolution of sacrificial layers of (a) PAA and (b) dextran in water.

In accordance with the invention, once a water-soluble sacrificial layer is formed and the relevant structural materials are formed at selected locations, the sacrificial layer is then removed by contacting the sacrificial layer with water. The dissolution of a sacrificial layer in water was experimentally verified by carrying out a process in which arrays of discs of SU8-2010 photoresist were formed on a sacrificial layer and then the sacrificial layer was removed, lifting off the discs. As shown in FIG. 2A, after a selected water-soluble polymer sacrificial layer 30 was deposited on a silicon substrate 20, discs 40 of SU8-2010 photoresist were patterned directly on the sacrificial layer in a single step of photolithography, to form the structure 10 shown in side view in FIG. 2A. The diameter of the disks 40 ranged from 20 μm to 1200 μm. The structure 10 was then immersed in water to release the sacrificial layer 30. (FIG. 2B) FIG. 3 is a plot of the time required to fully lift off 10-μm-thick discs made of SU8, by dissolution of sacrificial layers of (a) PAA and (b) dextran in water. Error bars indicate deviation from the mean (n=3). This data shows that the discs prepared on PAA lifted-off twice as rapidly as those on dextran.

Table 2 provides a comparison of the etching rates of PAA and dextran with that of other types of materials used as sacrificial layers, such as $SiO_2$, phosphosilicate glass, poly(imide)s (e.g., thermally cured P12610 epoxy resin from HD Microsystems, Parlin, N.J.), and positive photoresists (e.g., resins based on novolak-diazquinone, such as AZ 1518, AZ4400 and AZ4620 from Clariant; Charlotte, N.C.). The films were prepared by spin-coating (3000 rpm, 15 s) from a 5% (w/v) polymer solution in water, except for the polymers with a poor solubility in water, including poly(ethylene oxide) 100 kDa (1% w/v), poly(methacrylic acid) (1.7% w/v), and poly(vinyl alcohol) (2.5% w/v). The films were then dried by placing the substrates on a hot plate at 150° C. for 2 minutes. With respect to film uniformity, the term "good" as used in Table 2 is a subjective finding of fewer than two inhomogeneities detectable by optical microscopy (bright field mode) on a 3-inch wafer. Regarding film solubility, the term "good" as used in Table 2 indicates that dissolution of the film in water required less than 1 second. It is recognized that the etch rate of a sacrificial layer can depend on the geometry of the item to be released. The data presented in Table 2 do not take into account a dependence on geometry, and should only be used as guidelines. These data suggest that water-soluble sacrificial layers dissolve in water up to four orders of magnitude more rapidly than conventional sacrificial materials in their respective etchant, e.g., $SiO_2$ in 1% HF. The selectivity of water to PAA and dextran relative to other materials is also much better than that of traditional etchants, such as HF, to silicon nitride.

Figure 4:
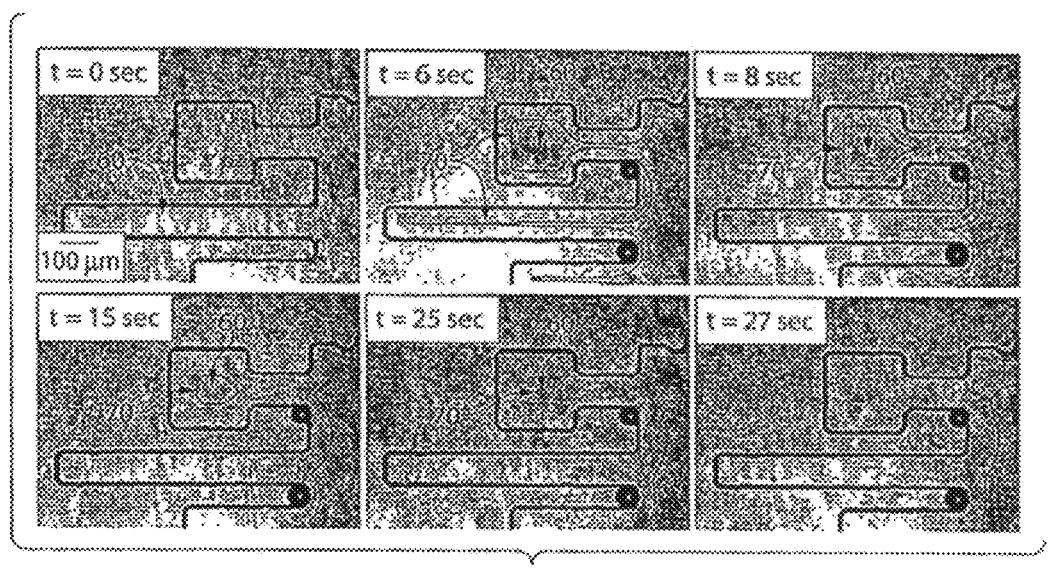
FIG. 4 shows time-lapse pictures of the dissolution of a 1 micron thick sacrificial layer of dextran.

This high etch selectivity of water-soluble sacrificial layers was experimentally demonstrated by a further lift-off process in which PAA was employed as a sacrificial layer on plastic discs or ITO-coated substrates. FIG. 4 shows pictures of film 60, a 200×200 μm² square cantilever prepared in epoxy photoresist (SU8-2010) from a sheet of PET coated with an ITO film, at various time intervals while immersed in water. Dissolution boundary 70 shows the progression of the PAA removal of film 60 over the course of the lift-off process. As shown in the FIG. 4, within about 27 seconds, the structures are completely undercut. This rapid sacrificial layer removal was further experimentally demonstrated by a lift off process employing 4 cm² solid sheets of polymerized SU8 formed on a layer of dextran. The SU8 sheets were completely removed after soaking the substrate for ~12 hours in water.

Figure 5A:
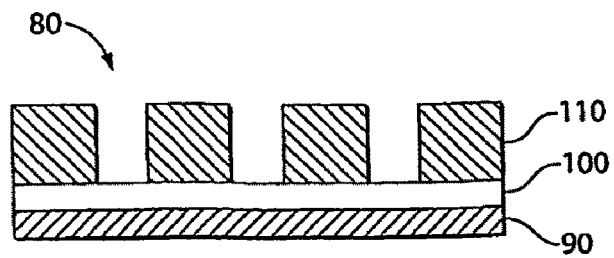
FIG. 5 shows a schematic illustration of the microfabrication of metal features by electrodeposition through a patterned mask, according to one embodiment of the invention.
Figure 5B:
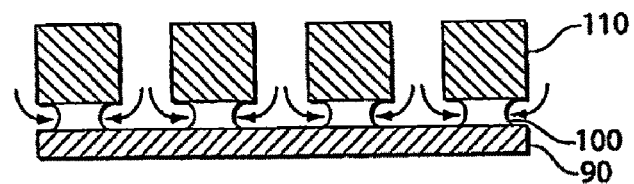
Figure 5C:
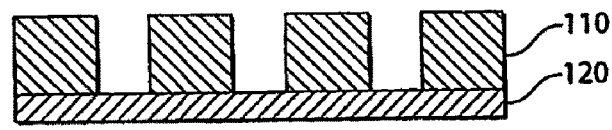
Figure 5D:
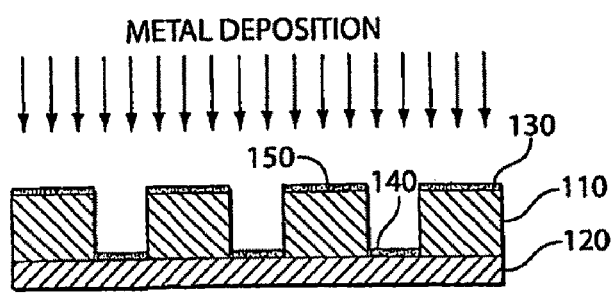
Figure 5E:

In accordance with the invention, this rapid dissolution of water-soluble polymer sacrificial layers can be employed for the release of micro-structured films that cover distances up to the size of a wafer. This capability was experimentally demonstrated with cm-scale structures of SU8 on PAA films employed as a mask for shadow evaporation of metal films. FIGS. 5A-E provide cross-sectional views of the steps in the process. As shown in FIG. 5A, a PAA film 100 was formed on substrate 90, and SU8 layer 110 was spin-coated on PAA film 100 and then structured by photolithography to form structure 80. As shown in FIG. 5B, PAA film 100 was dissolved in water and SU8 layer 110 was retrieved by lift-off. The SU8 structured film 110, acting as a shadow mask, was placed on a second substrate 120. (FIG. 5C) A thin layer of metal was deposited on the sample via metal deposition to form layer 130, wherein layer 130 comprises metal structures 140 formed on the surface of PAA film 110 and metal structures 150 formed on the surface on substrate 120. FIG. 5E shows the removal of SU8 layer 110 to reveal the pattern of metallic structures 140 deposited through the openings of the shadow-mask.

Figure 6A:
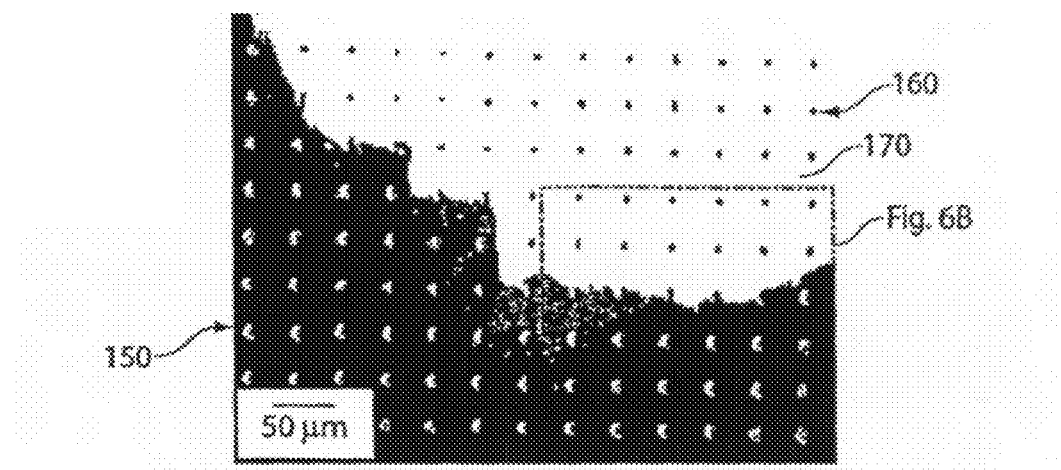
FIG. 6 shows optical microscopy images of gold features electrodeposited using a patterned mask, according to one embodiment of the invention.
Figure 6B:
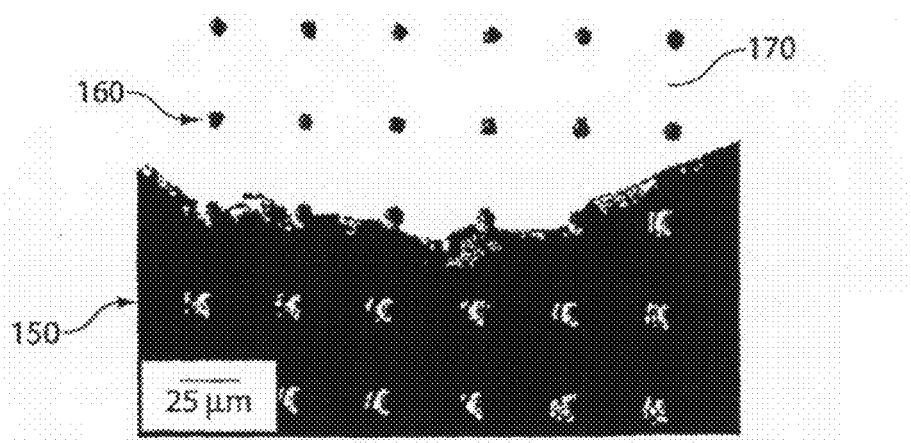

FIGS. 6A-B provide two optical microscopy images of Au features produced on a substrate 170 employing the process of FIG. 5. A layer of gold was deposited onto mask 150, having pentagonal openings. Mask 150 was broken with tweezers and partially removed, as shown in FIG. 6A, to expose gold features 160 formed on substrate 170 through the openings of mask 150. FIG. 6B shows a magnified picture of mask 150, partially removed to expose gold features 160. It is to be recognized that it can be preferred to obtain SU8 sheets that remain flat over a large area (i.e., >10 mm$^2$) to achieve a sufficient contact between the mask and the substrate during metal deposition.

In accordance with the invention, the solubility of a water-soluble polymer sacrificial material can be selectively modified during a fabrication sequence by an ion exchange process. It is recognized that the ease of dissolution of the water-soluble films is an advantage for: i) quick release of features by lift-off, and, ii) applications involving materials that are incompatible with currently used etchants. The ease of dissolution of the water-soluble films is, however, a limitation for micromachining or other fabrication processes that require exposure of the sacrificial material to aqueous solutions prior to their intended removal. In accordance with the invention, this limitation can be overcome by treating a sacrificial layer with an appropriate chemical that modifies the water-solubility of the film, e.g., to reduce or eliminate the water-solubility of the film. Then, as explained in detail below, the water-solubility of the film can be restored as-desired for a given fabrication sequence.

For example, a sacrificial layer comprising PAA can have side chains that are associated with (e.g., form a bond, such as an ionic bond, with) a univalent ion, such as $Na^+$, causing the PAA to be soluble in water. The PAA sacrificial layer may be treated with a bivalent ion, such as $Ca^+$, such that the side chains of the PAA become associated with the bivalent ion, causing the PAA to be insoluble in water. The bivalent ion may be removed from the poly(acrylic acid) (e.g., by treatment with a univalent ion, such as $Na^+$) at any point during the fabrication process such the sacrificial material becomes soluble in aqueous solution, and thus, can be removed by treatment with aqueous solution. For example, considering a PAA sacrificial layer, the side chains of the PAA polymer contain ($Na^+$)carboxylate groups. If the $Na^+$ ions are exchanged for calcium ions the PAA chains become cross-linked producing a substantially water-insoluble PAA-$Ca^{2+}$ polymer. In accordance with the invention, exposure of a PAA sacrificial layer to a source of calcium ions is carried out to produce a sacrificial layer that is temporarily rendered water-insoluble. This solubility modification can also be achieved with other bivalent ions, such as $Cu^{2+}$ in the form of an aqueous solution of $CuCl_2$ and $CuSO_4$. It was experimentally found that trivalent ions such as $Cr^{3+}$ do not in general render a PAA film water-insoluble, however.

The solubility of a PAA layer is modified by, e.g., soaking the layer in a selected solution. For example, a PAA layer can be rendered water-insoluble by soaking the layer in a 1 M aqueous $CaCl_2$ solution for 1 minute. The resulting PAA-$Ca^{2+}$ layer is found to be stable for at least 1 hour in water.

It was experimentally verified that PAA layers having thicknesses of less than 700 nm do not dissolve when immersed in a solution of $CaCl_2$ and are rendered water-insoluble. PAA films thicker than 700 nm also are rendered water-insoluble, but can lose their adhesion to an underlying substrate or other adjacent material. To improve the adhesion of the PAA films on, e.g., silicon wafers, it can be preferred to employ an adhesion layer, e.g., a layer prepared with an acidic solution of PAA (pH ~2.5).

In an experimental verification of this technique, a 5% (w/v) acidic solution of PAA was spin-coated on a substrate and baked at 150° C. on a hot plate for 15 minutes. The resulting films of acidic PAA are found to become water-insoluble after prolonged baking on Si or quartz substrates, but not in general on glass and metal-coated surfaces. These observations suggest that the PAA chains form a covalent bond with the $SiO_2$ surface, given that Si wafers have a native layer of $SiO_2$ on their surface. It is understood that above a temperature of ~100° C., the formation of esters is favored by condensation of the carboxylic groups of PAA with the silanols of the silicon through the loss of water by evaporation (R—COOH+R'—SiOH↔R—COO—Si—R'+$H_2O$). The resulting PAA film is no longer soluble in water.

With such a thin, baked film of PAA in place, a second PAA film, deposited from a solution of neutral pH, can then be formed atop the first film. The second, upper PAA film can then be subjected to treatment with a $CaCl_2$ solution for modifying its solubility. It was experimentally verified that the aqueous dissolution of PAA films with thicknesses up to 9 μm can be prevented with this two-step procedure.

In accordance with the invention, once a water-soluble sacrificial layer is rendered water-insoluble, the fabrication step or steps involving water exposure of the layer are carried out, and then the sacrificial layer can again be rendered water-soluble, thereby enabling removal of the layer by a final exposure to water. For example, a water-insoluble PAA-$Ca^{2+}$ layer can be rendered water-soluble again by immersion in a solution of NaCl ([NaCl]=10 mM-1 M). The excess of sodium ions in solution displaces the calcium ions in the PAA-$Ca^{2+}$ film, and dissolves the calcium-exchanged PAA film within 1 s for solutions of >10 mM NaCl.

It was experimentally found that films of PAA-$Ca^{2+}$ are completely insoluble in water, but have only a limited stability (e.g., immersion for ~5 minutes) in an aqueous solution of salts, such as 100 μM NaCl, pH 4 HCl or pH 9 NaOH. It is found, however, that the addition of $CaCl_2$ to the aqueous solutions of other salts improves the stability of the PAA-$Ca^{2+}$ films by several orders of magnitude. For example, PAA-$Ca^{2+}$ films can remain insoluble for several hours in a 500 mM NaCl solution containing an equimolar quantity of $Ca^{2+}$ ions. More generally, the presence of 0.1 equivalents of $Ca^{2+}$ in solution relative to the sum of all the monovalent cations is understood to be sufficient to maintain the insolubility of PAA-$Ca^{2+}$ films.

This approach may not, however, prove successful in very alkaline solutions, because the calcium ions precipitate in the form of $Ca(OH)_2$, and can not be maintained at a sufficiently high concentration to maintain the ionic cross-linking of PAA. As a result, alkaline developers with pH values of 12-13 (such as the 351 developer used for Shipley positive photoresists) are currently not compatible with PAA sacrificial films.

The utility of ionic cross-linking a water-soluble polymer such as PAA for modifying its water-solubility in accordance with the invention is demonstrated by an experimental example in which metallic features were fabricated by electrodeposition of nickel through a structured film of PAA. This example further demonstrates that the sacrificial layer can itself be patterned for producing a selected structure.

Figure 7A:
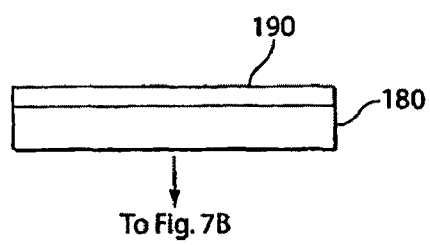
FIG. 7 shows a schematic illustration of the microfabrication of nickel features by electrodeposition through a film of patterned PAA.
Figure 7B:
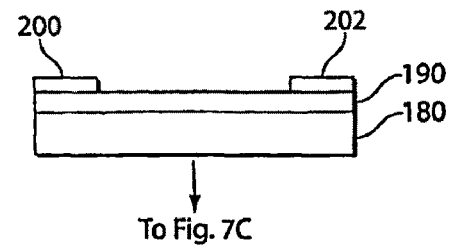
Figure 7C:
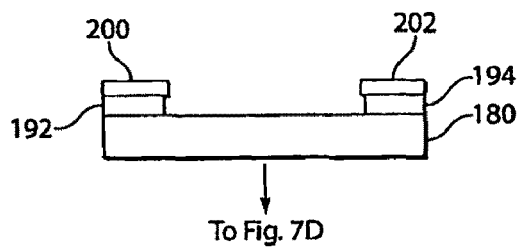
Figure 7D:
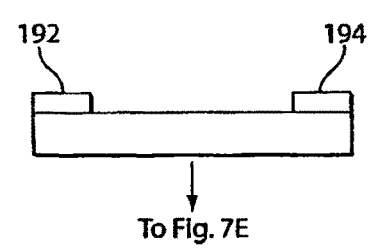

As shown in FIG. 7A, ITO-coated poly(ethylene terephtalate) (PET) substrate 180 was coated with PAA film that was treated to produce PAA-$Ca^{2+}$ layer 190. SU8 regions 200 and 202 were formed as photoresists for defining the structures. (FIG. 7B) The PAA-$Ca^{2+}$ layer 190 was patterned by selectively dissolving the PAA-$Ca^{2+}$ layer 190 with NaCl through openings of a photostructured film of SU8 to form PAA-$Ca^{2+}$ structures 192 and 194, as shown in FIG. 7C. The SU8 mask (e.g., comprising SU8 regions 200 and 202) was then removed by immersion in NMP. (FIG. 7D) The etchant was provided as 1 M NaCl, containing a detergent (0.05% Tween), to ensure that the aqueous solution could wet the surface of the SU8. The saline solution could then penetrate through the openings with small diameters (i.e., <50 µm) in the SU8 to reach the exposed film of PAA-$Ca^{2+}$ (e.g., comprising PAA-$Ca^{2+}$ structures 192 and 194). In general, removal of polymerized SU8 can be difficult and can require the application of a release layer. In this experimental example it was found that SU8 can be removed from the PAA-based films much more rapidly (i.e., in less than one hour) than from the surface of silicon wafers. It is, therefore, understood in accordance with the invention to be more convenient to pattern a sacrificial layer such as a PAA-based film using an SU8 mask than to use SU8 directly on the substrate. This provides a further advantage as well as utility of the sacrificial layers of the invention.

Figure 7E:
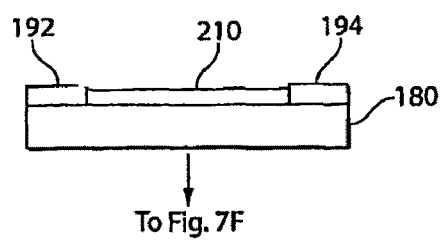
Figure 7F:
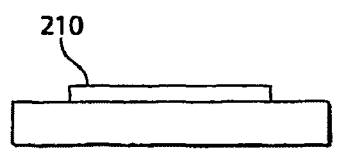

With the resulting PAA-$Ca^{2+}$ structures 192 and 194, nickel was electroplated by dipping the substrate into a commercial solution of nickel sulfamate, with currents of 1 or 20 $mAcm^{-2}$ to form nickel layer 210. (FIG. 7E) The substrate 180 was found to adequately conduct the electric current required for the deposition of metal into the openings of the patterned film of PAA-$Ca^{2+}$ (e.g., comprising PAA-$Ca^{2+}$ structures 192 and 194). With deposition complete, PAA-$Ca^{2+}$ structures 192 and 194 were then removed by etching in the NaCl solution described above. (FIG. 7F)

Figure 8A:
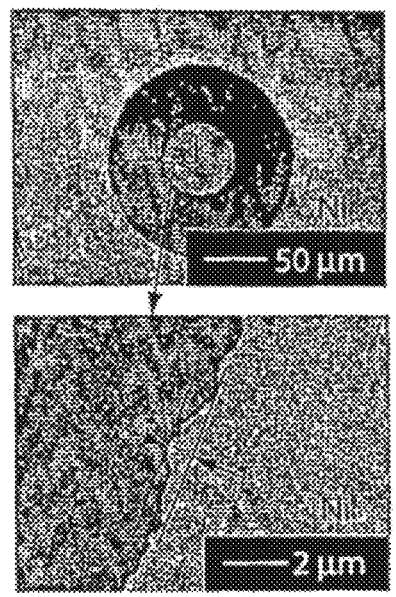
FIG. 8 shows SEM images of electrodeposited nickel on an ITO-coated PET substrate, according to one embodiment of the invention.
Figure 8B:
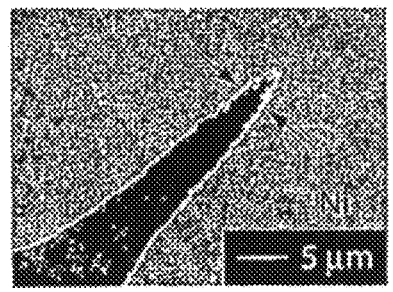
Figure 8C:
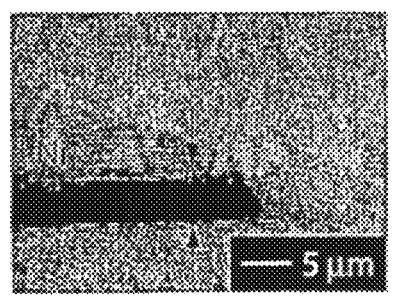

FIG. 8A shows SEM images of the edge resolution of nickel layer 210, at both low and high magnifications. FIG. 8B shows an SEM image of the lateral resolution of nickel layer 210. The SEM images indicate that the edge roughness and lateral resolution achieved for the nickel features was similar to that of the transparency photomasks used to pattern the initial layer of SU8, i.e., with a resolution of about 8 µm. Nickel ions are bivalent—like the $Ca^{2+}$ cations—and they cannot dissolve the PAA-$Ca^{2+}$ structures 192 and 194. The PAA-$Ca^{2+}$ structured layer was stable for at least 3 hours at 40° C. in a solution of nickel sulfamate, which is commercially available in the form of a "ready to use" solution for applications in electronics. This stability of the PAA-$Ca^{2+}$ structures 192 and 194 enables the preparation of thick features of nickel, such as the 5-µm-thick structure shown in FIG. 8C.

The edge resolution of a nickel feature as shown in the SEM image of FIG. 8A and the lateral resolution as shown in the SEM image of FIG. 8B were determined by the transparency mask used for the photolithography. The regions of nickel appear bright in the SEM images. As verified by the SEM of FIG. 7I, the PAA-$Ca^{2+}$ structures were stable in the commercial solution of nickel sulfamate for extended periods of time (>3 hours at 40° C.) during the electroformation of thick nickel features.

In accordance with the invention, free-standing MEMS structures, e.g., micron-scale surface-micromachined structures, can be fabricated using films of water-soluble polymer materials like PAA and dextran as sacrificial layers. Because the sacrificial layer etch conditions are particularly mild, this fabrication method of the invention is compatible with a wide variety of microelectronic materials, including semiconductors, insulators, metals, polymers, and other microelectronic materials.

Figure 9A:
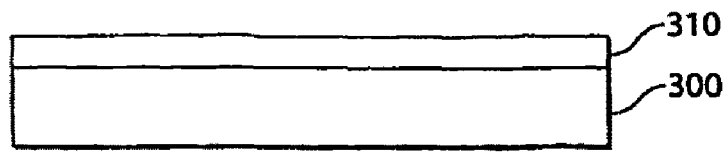
FIG. 9 shows a schematic illustration of the fabrication of free-standing polymeric structures using a water-soluble sacrificial layer, according to one embodiment of the invention.
Figure 9B:
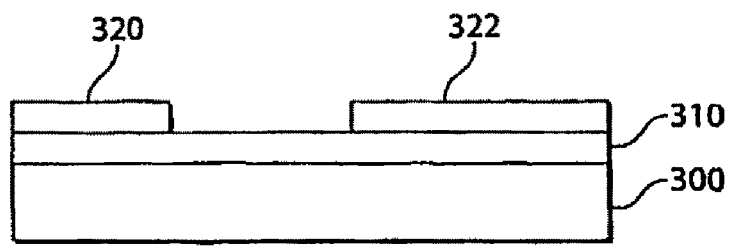
Figure 9C:
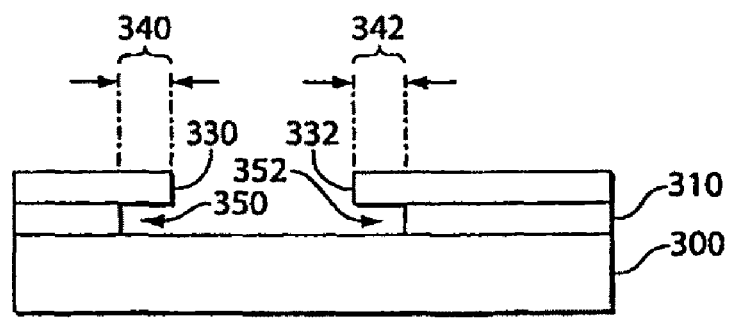

FIG. 9 shows an experimental example of free-standing structure fabrication, wherein PET, SU8 and aluminum were employed for producing cantilever and bridge structures supported by a water-soluble sacrificial layer over a substrate surface. In an illustrative embodiment, sacrificial layer 310 (e.g., a PAA-$Ca^{2+}$ layer) is formed on substrate 300, as shown in FIG. 9A. An SU8 film is formed on sacrificial layer 310 and is patterned using SU8 photolithography to form SU8 regions 320 and 322. (FIG. 9B) The sacrificial layer 310 may be removed as described herein to form SU8 structures 330 and 332 having free-standing lengths 340 and 342, respectively. Free-standing structures 330 and 332 are separated from substrate 300 by spaces 350 and 352, respectively. In some cases, bridges that span distances >500 µm on PET substrates may be formed, as shown in FIG. 9.

Figure 10:
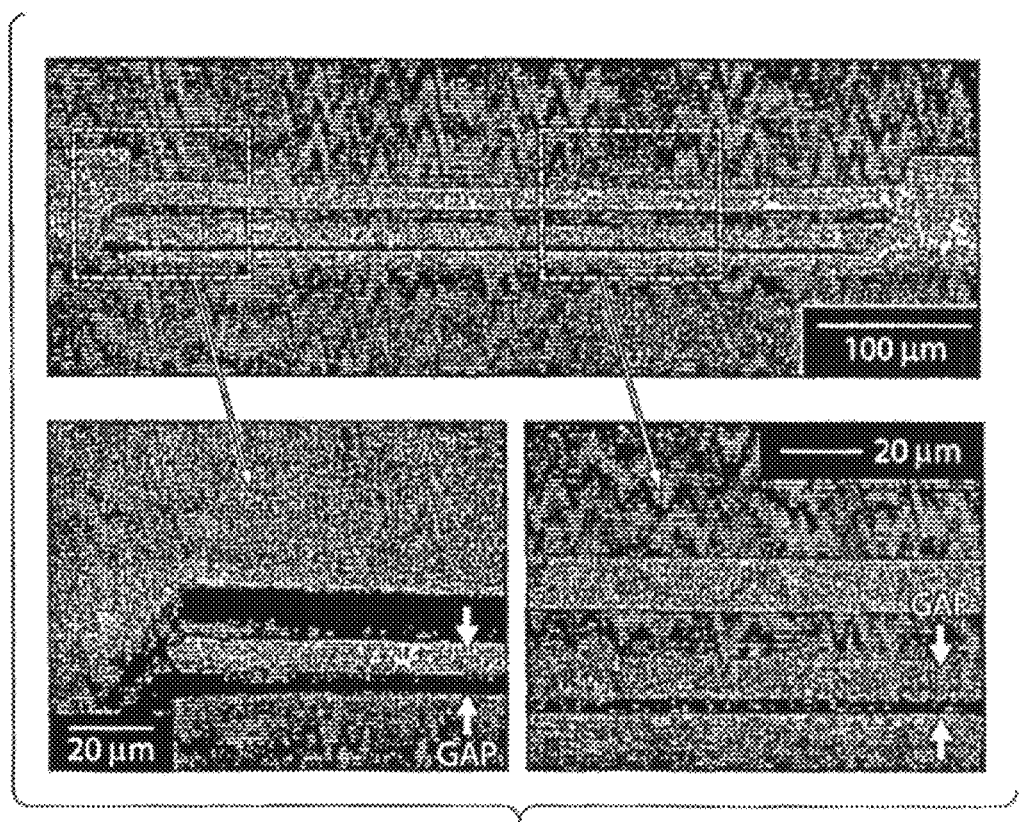
FIG. 10 shows SEM images of bridges of SU8 fabricated on a sheet of PET using a PAA sacrificial layers, according to one embodiment of the invention.
Figure 11:
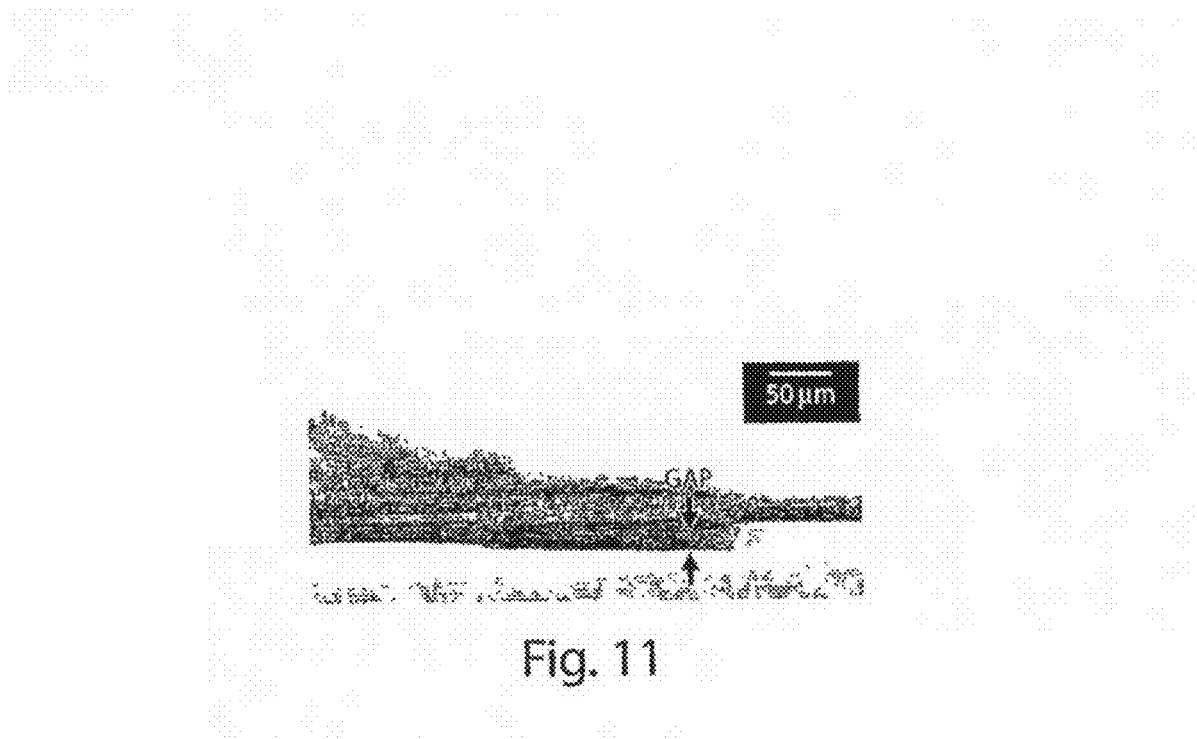
FIG. 11 shows an SEM image of a cantilever of SU8 prepared on a Si wafer, according to one embodiment of the invention.

In this surface micromachining technique, the sacrificial layer is etched in water until the small features become free-standing (~40 s), while larger structures remain bound to the substrate by the underlying, intact sacrificial layer. FIG. 10 provides SEM images of 80 µm-wide bridges of SU8 fabricated on a sheet of PET using a PAA sacrificial layer with a PAA solution at 19% w/v. Because all of the materials used in this process are insulating organic polymers, δ 10 nm-thick film of gold was provided on the sample to enable SEM observation. FIG. 11 is an SEM image of a cantilever of SU8 prepared on a Si wafer using a dextran film with a dextran solution at 20% w/v. The shape of the SU8 cantilever is identical to that of FIG. 4.

It is noted that if flexible, polymeric materials are to be employed as substrates for microfabrication, their Young's modulus must be considered in the design of the fabricated structures. The stress produced in the substrate while baking a thick sacrificial layer, e.g., a 10 µm-thick PAA layer, can deform a flexible substrate, e.g., a PET sheet. To reduce the deformation of the substrate, a force can be applied at the edges of the substrate during baking. For example, ~50 g metallic weights can be placed along the perimeter of the substrate. No deformation of the substrate occurs when using sub-micron thick sacrificial layers.

The difficulties of stiction caused by Van de Waals forces between a released suspended structure and a substrate are well-known. In accordance with the invention, this stiction can be reduced or inhibited, to avoid the collapse of a suspended structure to the substrate as the water used for the release is evaporated. In an example release technique for avoiding stiction, once a water-soluble sacrificial layer is sufficiently removed from a structure, the substrate is preferably immediately rinsed with isopropanol to quench the etch process, and then rinsed with hexanes to lower the surface tension upon release of the suspended structures. The free-standing structures can then be dried, if desired, to further inhibit collapse.

Figure 12A:
FIG. 12 shows a schematic illustration of the microfabrication of a structure having electrically conductive features, according to one embodiment of the invention.
Figure 12B:
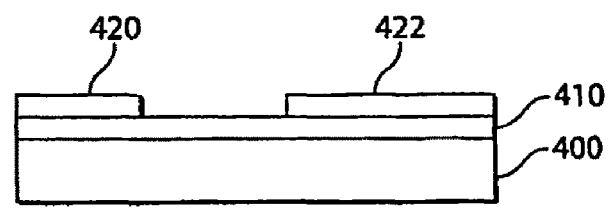
Figure 12C:
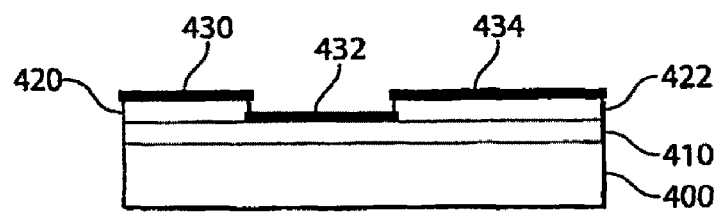
Figure 12D:
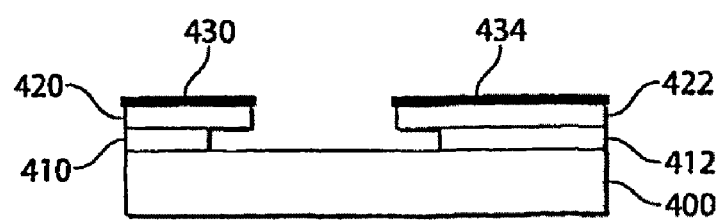
Figure 13:
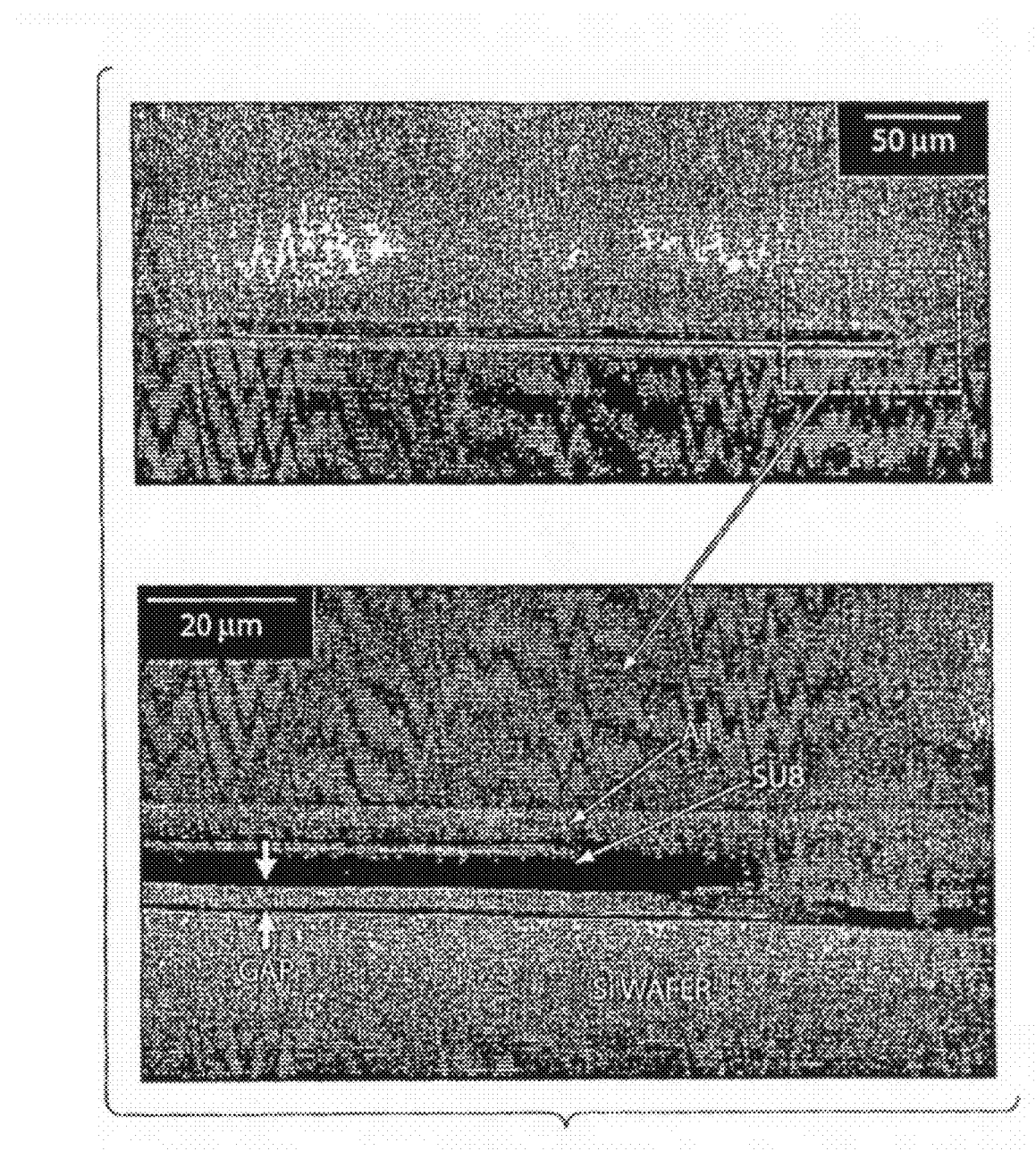
FIG. 13 shows SEM pictures of the side view of electrically conductive bridges prepared on a Si wafer using a PAA (19% w/v) sacrificial layer.

The invention further provides for the fabrication of free-standing structures including electrically conducting features. A schematic illustration of the microfabrication steps of an experimental demonstration of this process, based on the technique shown in FIG. 9, is shown in FIG. 12. Sacrificial layer 410 is formed on substrate 400 (FIG. 12A), and a pattered SU8 layer having regions 420 and 422 is formed on sacrificial layer 410. (FIG. 12B) To produce electrically conductive features, a metal film, e.g., a 50-nm aluminum film, comprising metal layer regions 430, 432, and 434 is evaporated on the structural material, e.g., SU8 or other selected microelectronic material, as shown in FIG. 12C, followed by an etch process in which the metal is lifted off as the sacrificial layer 410 is removed, as shown in FIG. 12D. FIG. 13 provides SEM pictures showing the side view of electrically conductive bridges prepared on a Si wafer using a PAA sacrificial layer at 19% w/v and a film of aluminum on an SU8 microstructure.

This process is especially appropriate for the use of PAA sacrificial layers because the aluminum film adheres poorly to the PAA, but adheres strongly to the SU8 structural material. In contact with water, the aluminum film on the PAA layer forms flakes that rapidly detach from the PAA surface, uncovering the underlying PAA film. Immersing the substrate in a sonication bath removes all of the aluminum on the PAA layer in less than 5 s with no damage to the metal-coated SU8 mechanical structures. Thereafter, the substrate can be maintained in water, to etch the sacrificial layer of PAA until the free-standing structures are released from the substrate, e.g., in ~40 s as shown in FIG. 9B. In contrast, evaporated aluminum shows good adhesion on dextran and lifting-off the aluminum films in water was slower than what was required to release the metal-coated features of SU8. This highlights that three major advantages to the use of PAA over dextran are found in accordance with the invention: i) the range of possible film thicknesses is greater with PAA than with dextran, ii) the solubility of PAA films can be chemically controlled by addition of $Ca^{2+}$ or $Cu^{2+}$ cations, and iii) the preparation of electrically conductive features is possible because metallic films adhere weakly to PAA.

In the experimental examples described above, the materials were obtained as follows: PAA 50 kDa and poly(methacrylic acid) were purchased from Polysciences (Warrington, Pa.). Dextran 66 kDa, chitosan, poly(ethylene oxide) 2 kDa, poly(vinyl alcohol) and poly(ethylene imine) were obtained from Sigma-Aldrich (St. Louis, Mo.). PAA 2 kDa, poly(ethylene oxide) 100 kDa and poly(acryl amide) were bought from $Sp^2$ (Scientific Polymer Products Inc., Ontario, N.Y.). SU8-2010 photoresist was purchased from Microchem (Newton, Mass.). ITO-coated PET substrates (200 μm thick, $R_s<10\Omega$) were obtained from Delta Technologies (Stillwater, N) and uncoated PET substrates (~100 μm thick) were bought from Policrom (Bensalem, Pa.).

The profilometry measurements described in the experimental examples were obtained with an Alpha-Step 200 from Tencor (San Jose, Calif.). The source of nickel for electrodeposition was an "S" nickel sulfamate ready to use (RTU) solution purchased from Technic Inc. (Providence, RI). The applied current for electrodeposition was controlled with a current generator Pentiostat/Galvanostat Model 273 from Princeton Applied Research (Oak Ridge, Tenn.). The photomasks for photolithography were obtained from CAD/Arts (Poway, Calif.).

The experimental examples of sacrificial layer preparation employed the following procedure: The PAA purchased as a 25% (w/v) solution in water was neutralized with saturated solution of NaOH until reaching a pH of 7.5 with a pH indicator band test, and then diluted to the appropriate concentration. The dextran solution was prepared by mixing the appropriate amounts of dextran and water in a vial; complete dissolution of dextran was obtained by placing the vial in a bath of hot water (90-95° C.). The silicon wafers were immersed in 5% aqueous solution of HCl for 5 minutes, rinsed with deionized water and dried with a stream of nitrogen gas. The surface of the polymeric substrates, such as the PET substrate, was rendered hydrophilic by a brief exposure in oxygen plasma (30 s, 18 W). Both of these treatments improved the wettability of the aqueous solutions of PAA and dextran on the substrates.

The solutions of water-soluble polymer were filtered (0.45 μm or 5 μm pore size for solutions of polymer with less or more than 5% (w/v), respectively) and dispensed onto the substrate until about 90% of the surface was covered with the solution. The sacrificial layer was then prepared by spin-coating the substrate at 1000-4000 rpm for 15 s, and baking the film on a hot plate (at 150° C. for silicon, or 95° C. for polymeric substrates) for 2 minutes.

The photoresist structures described in the experimental examples above were prepared according to the manufacturer's instructions. For the characterization of the etching speed of PAA and dextran, for the experiments with Ni-electrodeposition, and for the shadow mask evaporation of metals, sacrificial layers were prepared from solutions of polymer of 5% (w/v) and spun coat at 3000 rpm. The sacrificial layers for the free-standing structures were prepared from solutions of 19% PAA and 20% dextran (w/v) and spun coat at 1000 rpm. The characterization of the etching of the sacrificial layer was carried out with deionized water. For all other experiments Tween 20 was added, at a concentration of 0.05%, to improve the wettability of the water (or NaCl solution) on the SU8 features. The nickel was electrodeposited at constant current, between 1 and 20 $mAcm^{-2}$. The free-standing features were released by immersion in water for 40 s.

TABLE 1

Water-soluble polymers for sacrificial layers.

| Polymer | Film uniformity | Film solubility in water | Film solubility in water after photolithography | Roughness (RMS in nm) |
|---|---|---|---|---|
| Poly(acrylic acid) | good | good | good | 0.28 |
| Dextran | good | good | good | 0.27 |
| Poly(methacrylic acid) | good | good | good | |
| Poly(acrylamide) | good | good | | |
| Poly(ethylene imine) | good | in acidic or alkaline media | | |
| Poly(vinyl alcohol) | good | | | |
| Poly(ethylene oxide), 2 kDa | good | soluble in aqueous and non-aqueous solvents | | |
| Poly(ethylene oxide), 100 kDa | Semi uniform | | | |
| Chitosan | Semi-uniform | | | |
| Sucrose (table sugar) | Semi-uniform | | | |

TABLE 2

Etching rates of commonly used sacrificial layers.

| Material | Etchant | Rate (microns/min) |
|---|---|---|
| PAA, 50 kDa | water | 750 |
| Dextran, 66 kDa | water | 380 |
| $SiO_2$ (thermal) | HF 1% | 0.06 |
| PSG (15 wt % P) | HF 1% | 2.4 |
| $SiO_2$ (thermal) | conc. HF (24 M) | 1.3 |
| PSG (8 wt % P) | conc. HF (24 M) | 25 |
| Poly(imide) | oxygen plasma | 4 |
| Positive photoresist | acetone | 1 |

While several embodiments of the invention have been described and illustrated herein, those of ordinary skill in the art will readily envision a variety of other means and structures for performing the functions and/or obtaining the results or advantages described herein, and each of such variations, modifications and improvements is deemed to be within the scope of the present invention. More generally, those skilled in the art would readily appreciate that all parameters, materials, reaction conditions, and configurations described herein are meant to be exemplary and that actual parameters, materials, reaction conditions, and configurations will depend upon specific applications for which the teachings of the present invention are used. Those skilled in the art will recognize, or be able to ascertain using no more than routine experimentation, many equivalents to the specific embodiments of the invention described herein. It is, therefore, to be understood that the foregoing embodiments are presented by way of example only and that, within the scope of the appended claims and equivalents thereto, the invention may be practiced otherwise than as specifically described. The present invention is directed to each individual feature, system, material and/or method described herein. In addition, any combination of two or more such features, systems, materials and/or methods, provided that such features, systems, materials and/or methods are not mutually inconsistent, is included within the scope of the present invention.

In the claims (as well as in the specification above), all transitional phrases or phrases of inclusion, such as "comprising," "including," "carrying," "having," "containing," "composed of," "made of," "formed of," "involving" and the like shall be interpreted to be open-ended, i.e. to mean "including but not limited to" and, therefore, encompassing the items listed thereafter and equivalents thereof as well as additional items. Only the transitional phrases or phrases of inclusion "consisting of" and "consisting essentially of" are to be interpreted as closed or semi-closed phrases, respectively. The indefinite articles "a" and "an," as used herein in the specification and in the claims, unless clearly indicated to the contrary, should be understood to mean "at least one."

The phrase "and/or," as used herein in the specification and in the claims, should be understood to mean "either or both" of the elements so conjoined, i.e., elements that are conjunctively present in some cases and disjunctively present in other cases. Other elements may optionally be present other than the elements specifically identified by the "and/or" clause, whether related or unrelated to those elements specifically identified. Thus, as a non-limiting example, a reference to "A and/or B" can refer, in one embodiment, to A only (optionally including elements other than B); in another embodiment, to B only (optionally including elements other than A); in yet another embodiment, to both A and B (optionally including other elements); etc. As used herein in the specification and in the claims, "or" should be understood to have the same meaning as "and/or" as defined above. For example, when separating items in a list, "or" or "and/or" shall be interpreted as being inclusive, i.e., the inclusion of at least one, but also including more than one, of a number or list of elements, and, optionally, additional unlisted items. Only terms clearly indicated to the contrary, such as "only one of" or "exactly one of," will refer to the inclusion of exactly one element of a number or list of elements. In general, the term "or" as used herein shall only be interpreted as indicating exclusive alternatives (i.e. "one or the other but not both") when preceded by terms of exclusivity, such as "either," "one of," "only one of," or "exactly one of."

As used herein in the specification and in the claims, the phrase "at least one," in reference to a list of one or more elements, should be understood, unless otherwise indicated, to mean at least one element selected from any one or more of the elements in the list of elements, but not necessarily including at least one of each and every element specifically listed within the list of elements and not excluding any combinations of elements in the list of elements. This definition also allows that elements may optionally be present other than the elements specifically identified within the list of elements that the phrase "at least one" refers to, whether related or unrelated to those elements specifically identified. Thus, as a non-limiting example, "at least one of A and B" (or, equivalently, "at least one of A or B," or, equivalently "at least one of A and/or B") can refer, in one embodiment, to at least one, optionally including more than one, A, with no B present (and optionally including elements other than B); in another embodiment, to at least one, optionally including more than one, B, with no A present (and optionally including elements other than A); in yet another embodiment, to at least one, optionally including more than one, A, and at least one, optionally including more than one, B (and optionally including other elements); etc.

All references cited herein, including patents and published applications, are incorporated herein by reference. In cases where the present specification and a document incorporated by reference and/or referred to herein include conflicting disclosure, and/or inconsistent use of terminology, and/or the incorporated/referenced documents use or define terms differently than they are used or defined in the present specification, the present specification shall control.

What is claimed:

1. A method for microfabrication or other small-scale fabrication process, comprising:
    forming a sacrificial material comprising a polymer on a substrate, wherein the polymer is soluble in aqueous solution;
    treating the sacrificial material with a bivalent ion such that the polymer becomes substantially insoluble in aqueous solution;
    removing the bivalent ion from the sacrificial material such the polymer becomes soluble in aqueous solution; and
    removing the sacrificial material.

2. A method as in claim 1, further comprising carrying out a fabrication process in aqueous solution while the polymer is substantially insoluble in aqueous solution.

3. A method as in claim 1, wherein the polymer is poly(acrylic acid), dextran, poly(methacrylic acid), poly(acrylamide), poly(ethylene imine), poly(vinyl alcohol), poly(ethylene oxide), chitosan, or sucrose.

4. A method as in claim 3, wherein the polymer is poly(acrylic acid), dextran, or poly(methacrylic acid).

5. A method as in claim 4, wherein the polymer is poly(acrylic acid).

6. A method as in claim 5, further comprising forming an adhesion layer on the substrate.

7. A method as in claim 6, wherein the adhesion layer comprises poly(acrylic acid).

8. A method as in claim 1, wherein the bivalent ion is $Ca^{2+}$ or $Cu^{2+}$.

9. A method as in claim 1, wherein the bivalent ion is $Ca^{2+}$.

10. A method for microfabrication or other small-scale fabrication process, comprising:
    forming a sacrificial material comprising poly(acrylic acid) on a substrate, wherein the poly(acrylic acid) is associated with a univalent ion and the sacrificial material is soluble in aqueous solution;
    treating the sacrificial material with a bivalent ion, such that the poly(acrylic acid) becomes associated with the bivalent ion and the sacrificial material becomes substantially insoluble in aqueous solution;
    carrying out a fabrication process, using the poly(acrylic acid) as sacrificial material; and removing the bivalent ion from the poly(acrylic acid) such the sacrificial material becomes soluble in aqueous solution; and removing the sacrificial material.

11. A method as in claim 10, wherein the univalent ion is $Na^+$.

12. A method as in claim 10, wherein the bivalent ion is $Ca^{2+}$ or $Cu^{2+}$.

13. A method as in claim 12, wherein the bivalent ion is $Ca^{2+}$.

14. A method as in claim 1, wherein the solvent is an aqueous solvent, comprising:

treating the polymer to lower the solubility of the polymer with respect to the solvent by subjecting the polymer to a first ion exchange reaction;

carrying out the fabrication process, using the polymer as sacrificial material;

after fabrication, treating the polymer to increase the solubility of the polymer with respect to the solvent by subjecting the polymer to a second ion exchange reaction; and removing the polymer at least in part by dissolving the polymer in the solvent.

15. A method as in claim 14, wherein the first ion exchange reaction comprises replacing at least some univalent ion in the polymer with bivalent ion, and the second ion exchange reaction comprises replacing at least some bivalent ion in the polymer with univalent ion.

16. A method as in claim 1, wherein the sacrificial material comprises a first portion and a second portion, the method comprising treating the first portion of the sacrificial material with the bivalent ion such that the first portion becomes substantially insoluble in aqueous solution and the second portion is not treated with the bivalent ion.

17. A method as in claim 16, further comprising removing the first portion of the sacrificial material.

18. A method as in claim 16, further comprising removing the second portion of the sacrificial material.

19. A method for microfabrication or other small-scale fabrication process, comprising:

forming a sacrificial material comprising a polymer on a substrate, wherein the sacrificial material comprises a first portion and a second portion and wherein the polymer is soluble in aqueous solution;

treating the first portion of the sacrificial material with a bivalent ion such that the polymer becomes substantially insoluble in aqueous solution, without similarly treating the second portion;

removing the second portion of the sacrificial material:, removing the bivalent ion from the first portion of the sacrificial material; and removing the first portion of the sacrificial material.

20. A method as in claim 19, wherein the polymer is poly (acrylic acid), dextran, poly(methacrylic acid), poly(acrylamide), poly(ethylene imine), poly(vinyl alcohol), poly(ethylene oxide), chitosan, or sucrose.

21. A method as in claim 20, wherein the polymer is poly (acrylic acid), dextran, or poly(methacrylic acid).

22. A method as in claim 20, wherein the polymer is poly (acrylic acid).

23. A method as in claim 19, wherein the substrate further comprises an adhesion layer.

24. A method as in claim 23, wherein the adhesion layer comprises poly(acrylic acid).

25. A method as in claim 19, wherein the bivalent ion is $Ca^{2+}$ or $Cu^{2+}$.

26. A method as in claim 19, wherein the bivalent ion is $Ca^{2+}$.

* * * * *